United States Patent
Han et al.

(10) Patent No.: US 9,472,445 B2
(45) Date of Patent: Oct. 18, 2016

(54) SEMICONDUCTOR MEMORY DEVICE AND METHOD OF FABRICATING THE SAME

(71) Applicant: SAMSUNG ELECTRONICS CO., LTD., Suwon-si, Gyeonggi-do (KR)

(72) Inventors: Sang-Il Han, Seoul (KR); Jong-Un Kim, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 23 days.

(21) Appl. No.: 14/472,765

(22) Filed: Aug. 29, 2014

(65) Prior Publication Data

US 2015/0179641 A1 Jun. 25, 2015

(30) Foreign Application Priority Data

Dec. 23, 2013 (KR) ........................ 10-2013-0161552

(51) Int. Cl.
| | |
|---|---|
| *H01L 21/76* | (2006.01) |
| *H01L 21/762* | (2006.01) |
| *H01L 29/06* | (2006.01) |
| *H01L 21/8234* | (2006.01) |
| *H01L 21/768* | (2006.01) |
| *H01L 27/108* | (2006.01) |

(52) U.S. Cl.
CPC ....... *H01L 21/762* (2013.01); *H01L 21/76224* (2013.01); *H01L 21/76232* (2013.01); *H01L 21/76283* (2013.01); *H01L 21/76829* (2013.01); *H01L 21/76832* (2013.01); *H01L 21/823481* (2013.01); *H01L 27/10823* (2013.01); *H01L 29/0649* (2013.01); *H01L 27/10876* (2013.01)

(58) Field of Classification Search
None
See application file for complete search history.

(56) References Cited

U.S. PATENT DOCUMENTS

| | | | |
|---|---|---|---|
| 4,697,330 A * | 10/1987 | Paterson et al. | 438/261 |
| 6,770,530 B2 | 8/2004 | Efferenn et al. | |
| 7,250,346 B2 | 7/2007 | Chun et al. | |
| 7,807,543 B2 | 10/2010 | Shin et al. | |
| 7,871,897 B2 | 1/2011 | Shin et al. | |
| 8,138,523 B2 | 3/2012 | Bedell et al. | |
| 8,236,709 B2 | 8/2012 | Domenicucci et al. | |
| 8,288,217 B2 | 10/2012 | Guo et al. | |
| 2002/0127818 A1* | 9/2002 | Lee et al. | 438/424 |
| 2005/0077568 A1* | 4/2005 | Park et al. | 257/330 |
| 2008/0079085 A1* | 4/2008 | Schwan et al. | 257/369 |
| 2009/0256233 A1* | 10/2009 | Eun | H01L 21/76229 257/510 |

FOREIGN PATENT DOCUMENTS

| | | |
|---|---|---|
| KR | 10-2007-0058116 A | 6/2007 |
| KR | 10-2007-0106167 A | 11/2007 |
| KR | 10-2008-0010885 A | 1/2008 |
| KR | 10-2009-0067611 A | 6/2009 |

* cited by examiner

*Primary Examiner* — Fei Fei Yeung Lopez
(74) *Attorney, Agent, or Firm* — Lee & Morse, P.C.

(57) ABSTRACT

A semiconductor memory device including a substrate, a first element isolation film pattern, and a second element isolation film pattern. The substrate includes a first region and a second region. The first element isolation film pattern is in the first region and corresponds to a first active region. The second element isolation film pattern is in the second region and corresponds to a second active region. The first element isolation film pattern includes a first material and the second element isolation film pattern includes a second material different from the first material.

9 Claims, 15 Drawing Sheets

1000

1100

1200

SEMICONDUCTOR MEMORY DEVICE AND METHOD OF FABRICATING THE SAME

CROSS-REFERENCE TO RELATED APPLICATION

Korean Patent Application No. 10-2013-0161552, filed on Dec. 23, 2013, entitled, "Semiconductor Memory Device and Method of Fabricating the Same," is incorporated by reference herein in its entirety.

BACKGROUND

1. Field

One or more embodiments described herein relate to a semiconductor memory device and a method of fabricating the same.

2. Description of the Related Art

Memory devices may be made of a semiconductor material such as silicon, germanium, gallium arsenide, or indium phosphide. These devices may be classified as volatile memory devices or nonvolatile memory devices.

In a volatile memory device, data is lost when power is interrupted. Examples of a volatile memory device include a static random access memory, a dynamic random access memory, and a synchronous dynamic random access memory.

In a nonvolatile memory device, data is maintained when power is interrupted. Examples of a nonvolatile memory device include a read only memory, a programmable read only memory, an erasable programmable read only memory, an electrically erasable programmable read only memory, a flash memory device, a resistance memory device (e.g., a phase-change random access memory), a ferroelectric random access memory, and a resistive random access memory.

SUMMARY

In accordance with one embodiment, a semiconductor memory device includes a substrate including a first region and a second region; a first element isolation film pattern in the first region corresponding to a first active region; and a second element isolation film pattern in the second region corresponding to a second active region, wherein first element isolation film pattern includes a first material and the second element isolation film pattern includes a second material different from the first material. The first material may be an oxide, and the second material may be a nitride. The first material may be a nitride, and the second material may be an oxide.

The semiconductor memory device may include a first trench in the first region, and a second trench in the second region. The first element isolation film pattern may be in the first trench, and the second element isolation film pattern may be in the second trench. The semiconductor memory device may include a sidewall protection film on sidewalls of the first and second trenches. The sidewall protection film may include an oxide.

In accordance with another embodiment, a semiconductor memory device includes a substrate including a first region and a second region; a first element isolation film pattern in the first region corresponding to a first active region; a second element isolation film pattern in the second region corresponding to define a second active region; a first gate pattern in the first active region; and a second gate pattern in the second active region, wherein the first element isolation film pattern includes a first material and the second element isolation film pattern includes a second material different from the first material. The first material may be an oxide, and the second material may be a nitride. The first material may be a nitride, and the second material may be an oxide.

At least one of the first or second gate patterns may correspond to a recess channel transistor. A first trench may be in the first region, and a second trench may be in the second region. The first element isolation film pattern may be the first trench, and the second element isolation film pattern may be in the second trench. The semiconductor memory device may include a sidewall protection film on sidewalls of the first and second trenches. The sidewall protection film may include an oxide.

In accordance with another embodiment, a semiconductor device includes a first insulation material; a first transistor adjacent the first insulation material; a second insulation material; and a second transistor adjacent the second insulation material, wherein the first transistor is adjacent to the second transistor and has a conductivity type different from the second transistor, and wherein the first insulation material is different from the second insulation material.

The first insulation material may have a dielectric constant lower than the second insulation material. The first insulation material may include an oxide material, and the second insulation material may include a nitride material. The semiconductor memory device may include a sidewall protection film on the first insulation material, wherein the second insulation material includes a material of the sidewall protection film. The first transistor may be in a trench of the first insulation material, and the second transistor may be in a trench of the second insulation material.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
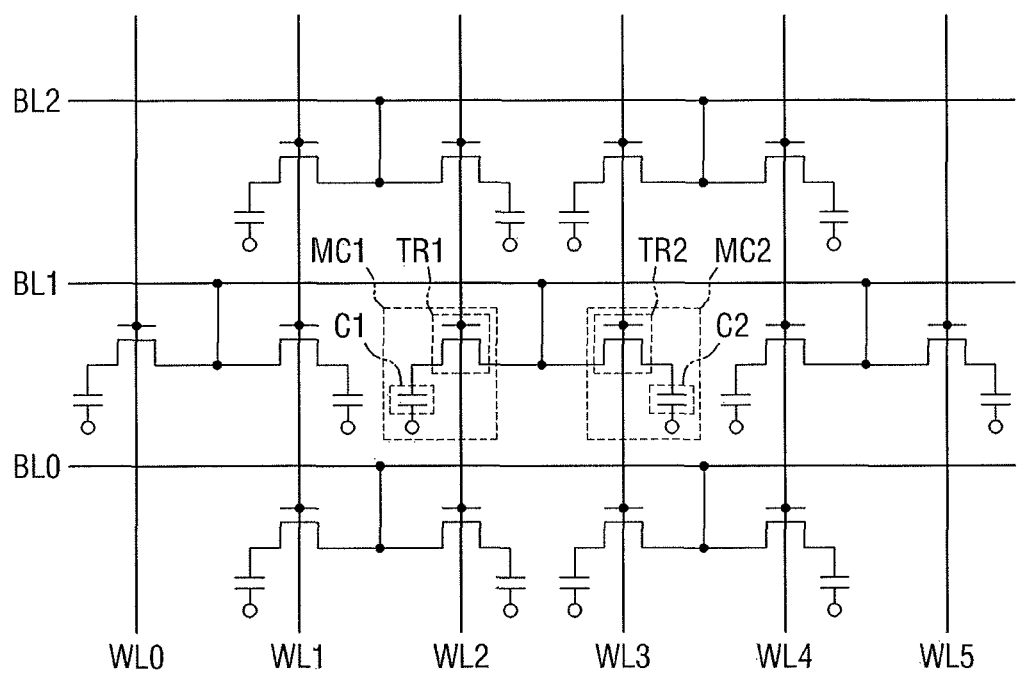
FIG. 1 illustrates an embodiment of a semiconductor memory device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" or "over" another layer, it can be directly under or over, or one or more intervening layers may be present. In addition, it will also be understood that when a layer is referred to as being "between" two layers, it can be the only layer between the two layers, or one or more intervening layers may also be present. Like reference numerals refer to like elements throughout.

In accordance with one or more embodiments of a semiconductor memory device and a method for fabricating this, different dielectric materials may be used to form shallow trench isolation (STI) gap-fill materials for NMOSFET and PMOSFET devices. Also, a continuous scaling-down of a dynamic random access memory (DRAM) may involve scaling-down core/peripheral regions, and/or scaling-down of a cell array region. The scaling-down of core/peripheral regions may be achieved, for example, by changing a planar transistor to a recess channel transistor (RCT). In this case, it is possible to ensure appropriate characteristics of the recess channel transistor by applying stress or a dielectric charge effect by changing the STI gap-fill material in the recess channel transistor. For example, a reduction of the threshold offset of the recess channel transistor to be applied to a sense amplifier may be achieved by using nitride in the NMOSFET and oxide in the PMOSFET as STI gap-fill materials.

Figure 2:
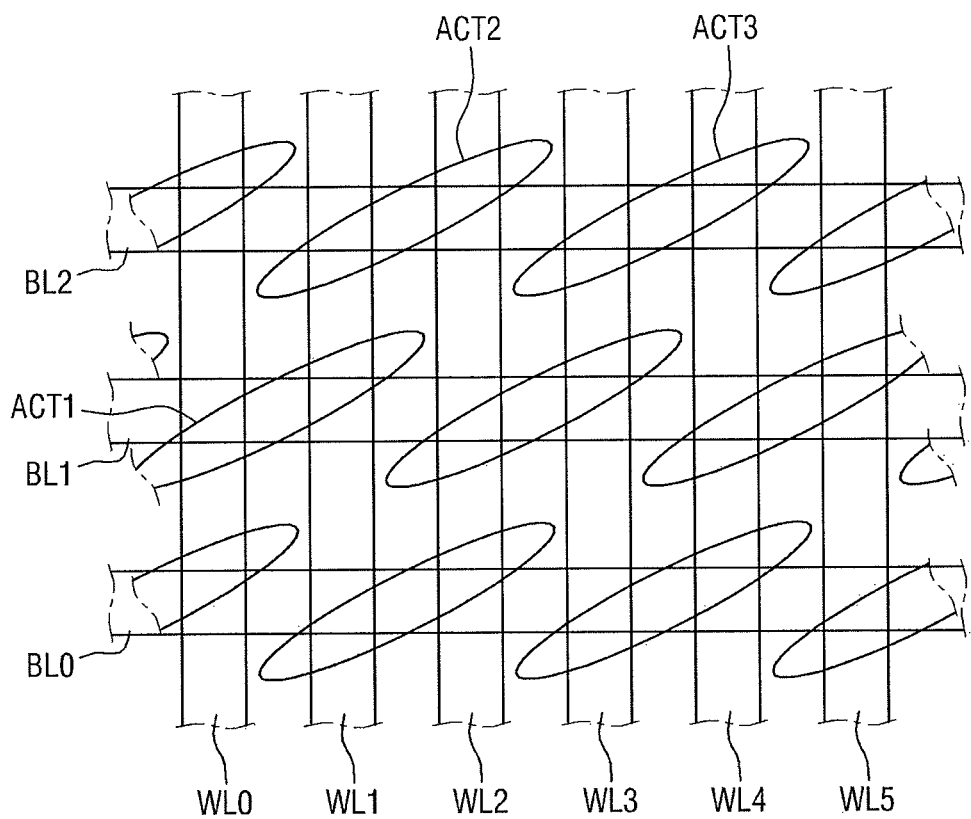
FIG. 2 illustrates an example of a layout of the semiconductor memory device.
Figure 2:
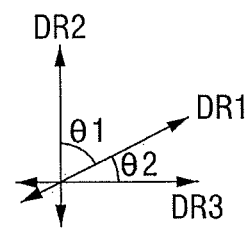

FIG. 1 illustrates an embodiment of a semiconductor memory device, and FIG. 2 illustrates an example of a layout of the semiconductor memory device. Referring to FIGS. 1 and 2, the semiconductor memory device may be a dynamic random access memory (DRAM) or another type of memory.

As shown in FIG. 1, the semiconductor memory device includes a plurality of word lines (e.g., WL0-WL5) and a plurality of bit lines (e.g., BL0-BL2). A plurality of memory cells (e.g., MC1, MC2) are electrically connected to the word lines WL0-WL5 and the bit lines BL0-BL2. The memory cells MC1 and MC2 may respectively include capacitors C1 and C2 for storing charge and access transistors TR1 and TR2 for controlling access to respective ones of the capacitors C1 and C2. As illustrated in FIG. 1, in one embodiment, the access transistors TR1 and TR2 may share or have a common source.

As shown in FIG. 2, unit active regions (e.g., ACT1-ACT3) are defined by forming element isolation regions in a substrate. For example, the unit active regions ACT1-ACT3 may be formed in a first direction DR1, and the word lines WL0-WL5 may be formed in a second direction DR2. The first and second directions DR1 and DR2 may be separated from one another by a predetermined angle. The bit lines BL0-BL2 may be formed a third direction DR3, which is separated from the first direction DR1 by a predetermined angle. The layout in FIG. 2 may be a layout of 6F2 cell structure.

In one embodiment, a predetermined angle may be understood to mean a smaller angle of two angles formed when two directions intersect each other. For example, if angles formed when two directions intersect each other are 120° and 60°, the predetermined angle may be understood to mean 60°. Thus, as shown in FIG. 2, an angle formed between the first direction DR1 and the second direction DR2 is $\theta 1$, and an angle formed between the first direction DR1 and the third direction DR3 is $\theta 2$. A layout having a cell structure different from a 6F2 structure may be implemented in alternative embodiments.

The predetermined angles $\theta 1$ and/or $\theta 2$ may be acute angles to ensure a maximum distance between bit line contacts connecting the unit active regions ACT1-ACT3 and the bit lines BL0-BL2 and storage node contacts connecting the active regions ACT1-ACT3 and capacitors. Angles $\theta 1$ and/or $\theta 2$ may be the same or different from one another. For example, angles $\theta 1$ and $\theta 2$ may be 45° and 45°, 30° and 60°, or 60° and 30°.

Two word lines (e.g., WL1, WL2) may be formed to cross one unit active region (e.g., ACT2). In this case, two access transistors may be formed for one unit active region ACT2.

As shown in FIG. 2, a plurality of unit active regions ACT1-ACT3 may be separated from each other. Further, a plurality of word lines WL0-WL5 and a plurality of bit lines BL0-BL2 may intersect each other. Thus, for example, a word line (e.g., WL2) corresponding to one unit active region ACT1 may cross (or overlap) another unit active region (e.g., ACT2). With respect to the unit active region ACT1, the word line WL2 passing in the vicinity of the unit active region ACT1 may be referred to as a passing gate. One passing gate may be between two adjacent active regions, e.g., one passing gate may be between the unit active region ACT1 which is adjacent to the unit active region ACT3 in FIG. 2.

Figure 3:
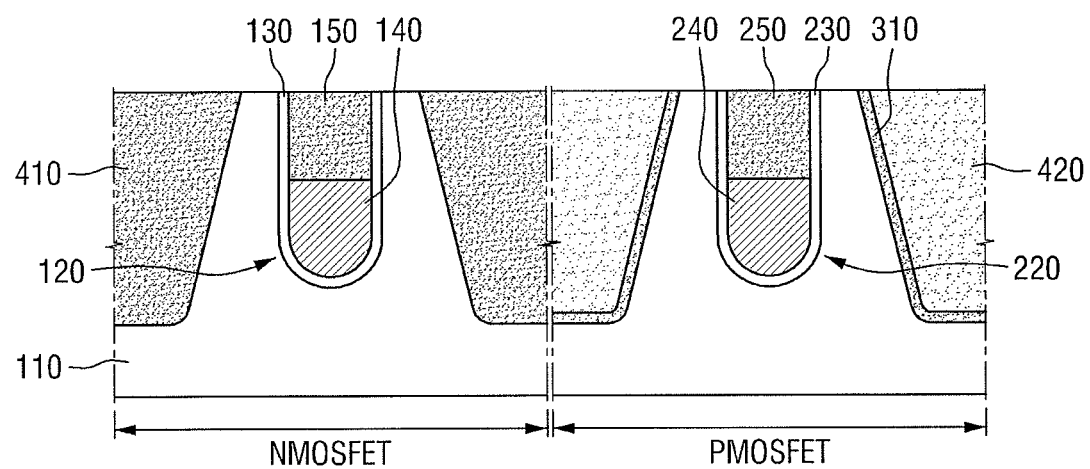
FIG. 3 illustrates different regions of the semiconductor memory device according to one embodiment.

FIG. 3 illustrates an embodiment of an active region and an element isolation region of the semiconductor memory device according to one embodiment. In this embodiment, there is illustrated a portion in which an NMOSFET region and a PMOSFET region of the semiconductor memory device are located adjacent to each other. The NMOSFET region and the PMOSFET region may be adjacent to one another, for example, in a sense amplifier adjacent to a cell region.

Referring to FIG. 3, the semiconductor memory device includes a substrate 110, a first element isolation film pattern 410, a second element isolation film pattern 420, a first gate pattern 120, a second gate pattern 220, and a sidewall protection film 310.

The substrate 110 includes a first region and a second region. For example, the first region may include the NMOSFET region, and the second region may include the PMOSFET region. The substrate 110 may be formed of at least one semiconductor material selected from the group consisting of Si, Ge, SiGe, GaP, GaAs, SiC, SiGeC, InAs, and InP. In one embodiment, the substrate 110 may be formed of a silicon on insulator (SOI). In the substrate 110, the first and second element isolation film patterns 410 and 420 may be formed, for example, by shallow trench isolation (STI) in order to separate a memory element from a transistor.

The sidewall protection film 310 may be formed on the sidewalls of first and second trenches. In order to repair damage generated during an etching process to form the first and second trenches, the sidewall protection film 310 may be formed of an oxide film by thermal oxidation, rapid thermal oxidation (RTO), in-situ steam generation (ISSG), or CVD. For example, the sidewall protection film 310 may be formed of an oxide film to repair damage to the sidewalls of the first and second trenches and to protect the sidewalls of the first and second trenches.

In FIG. 3, the sidewall protection film 310 is not illustrated as a separate layer on first element isolation film pattern 410 because the first element isolation film pattern 410 is deposited on the sidewall protection film 310 formed in the NMOSFET region (e.g., the first region). Here, an oxide forming the first element isolation film pattern 410 is mixed with oxide forming the sidewall protection film 310.

The first element isolation film pattern 410 is formed in the first region to define a first active region. The first element isolation film pattern 410 may be formed, for example, by filling a first material in the first trench formed in the first region.

The second element isolation film pattern 420 is formed in the second region to define a second active region. The second element isolation film pattern 420 may be formed, for example, by filling a second material in the second trench in the second region.

In one embodiment, the first and second materials may be different. For example, the dielectric constant of the first material may be lower than the dielectric constant of the second material. In one embodiment, the first material may be formed of oxide such as silicon oxide and the second material may be formed of nitride, e.g., silicon nitride. For example, the first material may be formed of high temperature oxide (HTO), medium temperature oxide (MTO), plasma enhanced tetraethyl orthosilicate (PE-TEOS), spin on glass (SOG), undoped silicate glass (USG), high density plasma (HDP), CVD oxide, tonen silazene (TOSZ), or a combination thereof.

By using different materials (e.g., a first material for the first element isolation film pattern 410 and a second material for the second element isolation film pattern 420), it is possible to improve transistor characteristics. For example, if the material for the first element isolation film pattern 410 in the first (NMOSFET) region is an oxide, the electric field generated between a gate electrode pattern and a depletion region is reduced, which is effective in reducing leakage of drain current. If the material for the second element isolation film pattern 420 in the second (PMOSFET) region is a nitride, it is possible to reduce a threshold voltage of the adjacent transistor by internal positive charges.

The first gate pattern 120 is formed in the first active region. The first gate pattern 120 may be formed of, for example, a type of a recess channel transistor (RCT) having a recessed channel. The first gate pattern 120 may include a first gate insulating film 130, a first gate 140, and a first capping film 150.

The first gate insulating film 130 may be formed in a gate trench in the first active region. The first gate insulating film 130 may not be formed on the upper surface of the substrate 110.

The first gate 140 may be formed to fill only part of the gate trench in the first active region, instead of completely filling the gate trench. For example, the first gate 140 may have a recessed shape. The first gate 140 may be made of a conductive material, e.g., metal, metal compound, or doped polysilicon.

The first capping film 150 may be formed on the first gate 140 to fill the remaining part of the gate trench in the first active region. Junction regions serving as source/drain regions may be formed on respective sides of the first gate 140. The bit line contacts or storage node contacts may be formed in the junction regions.

The first gate insulating film 130 may be formed in the gate trench in the first active region by CVD or thermal oxidation process. A first gate conductive film may be formed on the first gate insulating film 130 by physical vapor deposition (PVD) or a sputtering process. By removing part of the first gate conductive film by chemical mechanical polishing (CMP) and/or etch-back process, the first gate 140 may be formed.

The level of the upper surface of the first gate 140 may be lower than the level of the upper surface of the substrate 110. The first capping film 150 may be coated on the exposed first gate 140 to protect the first gate 140. The first capping film 150 may be formed by removing part of the first capping film 150, for example, by CMP and/or an etch-back process until the upper surface of the substrate 110 is exposed.

The first gate insulating film 130 may be formed, for example, of a silicon oxide film. The first gate pattern 120 including the first gate insulating film 130, the first gate 140, and the first capping film 150 may be used as the word lines WL for supplying a voltage of a pull-up power supply terminal to the bit lines BL in response to the potential of the bit lines BL. Further, by forming the junction regions to serve as source/drain regions using an ion implantation process, it is possible to complete a buried transistor including the first gate insulating film 130, the first gate 140, the first capping film 150, and the source/drain regions.

The second gate pattern 220 is formed in the second active region. The second gate pattern 220 may be formed of a type of RCT having a recessed channel. The second gate pattern 220 may include a second gate insulating film 230, a second gate 240, and a second capping film 250.

The second gate insulating film 230 may be formed in a gate trench in the second active region. The second gate insulating film 230 may not be formed on the upper surface of the substrate 110.

The second gate 240 may be formed to fill only a part of the gate trench in the second active region, instead of completely filling up the gate trench. For example, the second gate 240 may have a recessed shape. The second gate 240 may be made of a conductive material, e.g., metal, metal compound, or doped polysilicon.

The second capping film 250 may be formed on the second gate 240 to fill the remaining part of the gate trench in the second active region. Junction regions serving as source/drain regions may be formed on respective sides of the second gate 240. The bit line contacts or storage node contacts may be formed in the junction regions.

The second gate insulating film 230 may be formed in the gate trench in the second active region, for example, by CVD or thermal oxidation process. A second gate conductive film is formed on the second gate insulating film 230, for example, by PVD or a sputtering process. The second gate 240 may be formed by removing part of the second gate conductive film by CMP and/or etch-back process.

The level of the upper surface of the second gate 240 may be lower than the level of the upper surface of the substrate 110. The second capping film 250 may be coated on the exposed second gate 240 to protect the second gate 240. The second capping film 250 may be formed by removing part of the second capping film 250 by CMP and/or etch-back process until the upper surface of the substrate 110 is exposed.

The second gate insulating film 230 may be formed of, for example, a silicon oxide film. The second gate pattern 220 including the second gate insulating film 230, the second gate 240, and the second capping film 250 may be used as the word lines WL for supplying a voltage of a pull-down power supply terminal to the bit lines BL in response to the potential of the bit lines BL. Further, by forming the junction regions to serve as source/drain regions using an ion implantation process, it is possible to complete a buried transistor including the second gate insulating film 230, the second gate 240, the second capping film 250, and the source/drain regions.

Figure 4:
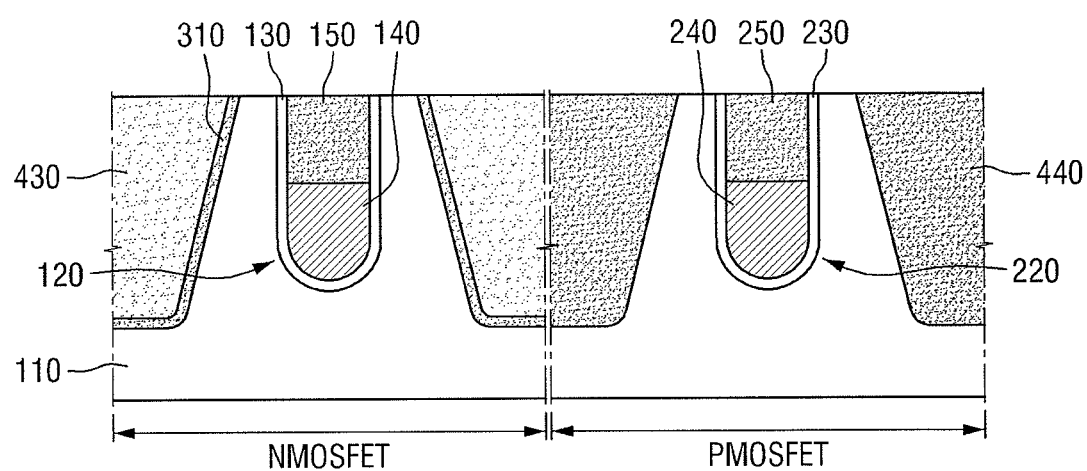
FIG. 4 illustrates different regions of the semiconductor memory device according to another embodiment.

FIG. 4 illustrates an active region and an element isolation region of a semiconductor memory device according to another embodiment. Referring to FIG. 4, this semiconductor memory device includes a substrate 110, a third element isolation film pattern 430, a fourth element isolation film pattern 440, a first gate pattern 120, a second gate pattern 220, and a sidewall protection film 310.

A first region and a second region are defined in the substrate 110. For example, the first region may be the NMOSFET region and the second region may be the PMOSFET region. In the substrate 110, the third and fourth element isolation film patterns 430 and 440 may be formed, for example, by shallow trench isolation (STI) to separate transistor and one or more memory elements.

The sidewall protection film 310 is formed on the sidewalls of first and second trenches. In order to repair damage generated during an etching process to form the first and second trenches, the sidewall protection film 310 may be formed, for example, of an oxide film by thermal oxidation, rapid thermal oxidation (RTO), in-situ steam generation (ISSG), or CVD. For example, the sidewall protection film 310 may be formed of an oxide film to repair damage to the sidewalls of the first and second trenches and to protect the sidewalls of the first and second trenches. In FIG. 4, the sidewall protection film 310 is not illustrated as a separate layer because the fourth element isolation film pattern 440 is deposited on the sidewall protection film 310 in the PMOSFET region, e.g., the second region. For example, an oxide forming the fourth element isolation film pattern 440 is mixed with oxide forming the sidewall protection film 310.

The third element isolation film pattern 430 is formed in the first region to define a first active region. The third element isolation film pattern 430 may be formed by filling a second material in the first trench formed in the first region.

The fourth element isolation film pattern 440 is formed in the second region to define a second active region. The fourth element isolation film pattern 440 may be formed by filling a first material in the second trench formed in the second region.

The first and second materials may be different. For example, the first material may be formed of an oxide such as silicon oxide, and the second material may be formed of a nitride such as silicon nitride. In one embodiment, the first material may be formed of high temperature oxide (HTO), medium temperature oxide (MTO), plasma enhanced tetraethyl orthosilicate (PE-TEOS), spin on glass (SOG), undoped silicate glass (USG), high density plasma (HDP), CVD oxide, tonen silazene (TOSZ), or a combination thereof.

By using different materials (e.g., the second material for the third element isolation film pattern 430 and the first material for the fourth element isolation film pattern 440), it is possible to exhibit transistor characteristics different from those in the previous embodiment. For example, by using different materials as the insulating materials for the third element isolation film pattern 430 and the fourth element isolation film pattern 440, it is possible to exhibit desired transistor characteristics.

The first gate pattern 120 is formed in the first active region. The second gate pattern 220 may be formed in the second active region. The first gate pattern 120 is formed, for example, of a type of RCT having a recessed channel. The first gate pattern 120 may include a first gate insulating film 130, a first gate 140, and a first capping film 150. Also, the second gate pattern 220 may be formed, for example, of a type of RCT having a recessed channel. The second gate pattern 220 may include a second gate insulating film 230, a second gate 240, and a second capping film 250.

Figure 5:
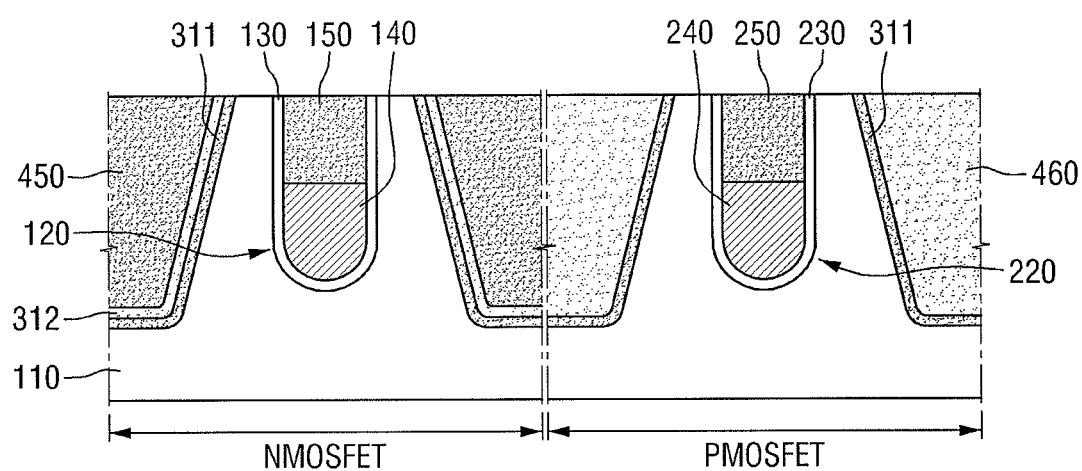
FIG. 5 illustrates different regions of the semiconductor memory device according to another embodiment.

FIG. 5 illustrates an active region and an element isolation region of a semiconductor memory device according to another embodiment. Referring to FIG. 5, the semiconductor memory device includes a substrate 110, a first sidewall protection film 311, a second sidewall protection film 312, a fifth element isolation film pattern 450, a sixth element isolation film pattern 460, a first gate pattern 120, and a second gate pattern 220.

The first sidewall protection film 311 is formed on the sidewalls of first and second trenches. In order to repair damage generated during an etching process to form the first and second trenches, the first sidewall protection film 311 may be formed of an oxide film, for example, by thermal oxidation, rapid thermal oxidation (RTO), in-situ steam generation (ISSG), or CVD. For example, the first sidewall protection film 311 may be formed of an oxide film to repair damage to the sidewalls of the first and second trenches and to protect the sidewalls of the first and second trenches.

The second sidewall protection film 312 may be formed, for example, by performing annealing for more than 20 minutes in the environment of a gaseous mixture containing NO and $N_2$ at a temperature of 850° C. or more after forming the first sidewall protection film 311. For example, the second sidewall protection film 312 may be formed of a nitride film. The second sidewall protection film 312 may serve as a pad for buffering stress when forming the fifth and sixth element isolation film patterns 450 and 460.

The fifth element isolation film pattern 450 is formed in the first region to define a first active region. The fifth element isolation film pattern 450 may be formed by filling a first material in the first trench formed in the first region.

The sixth element isolation film pattern 460 is formed in the second region to define a second active region. The sixth element isolation film pattern 460 may be formed by filling a second material in the second trench formed in the second region.

The first and second materials may be different. For example, the first material may be formed of an oxide such as silicon oxide, and the second material may be formed of a nitride such as silicon nitride. In one embodiment, the first material may be formed of high temperature oxide (HTO), medium temperature oxide (MTO), plasma enhanced tetraethyl orthosilicate (PE-TEOS), spin on glass (SOG), undoped silicate glass (USG), high density plasma (HDP), CVD oxide, tonen silazene (TOSZ), or a combination thereof.

Figure 6:
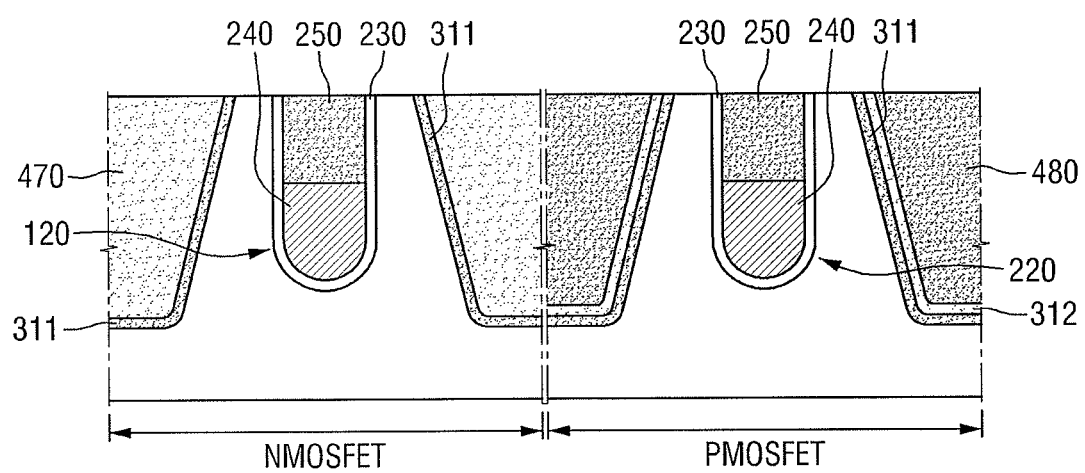
FIG. 6 illustrates different regions of the semiconductor memory device according to another embodiment.

FIG. 6 illustrates an active region and an element isolation region of a semiconductor memory device according to another embodiment. Referring to FIG. 6, the semiconductor memory device may include a substrate 110, a first sidewall protection film 311, a second sidewall protection film 312, a seventh element isolation film pattern 470, an eighth element isolation film pattern 480, a first gate pattern 120, and a second gate pattern 220.

The first sidewall protection film 311 is formed on the sidewalls of first and second trenches. In order to repair damage generated during an etching process to form the first and second trenches, the first sidewall protection film 311 may be formed of an oxide film, for example, by thermal oxidation, rapid thermal oxidation (RTO), in-situ steam generation (ISSG) or CVD. In one embodiment, the first sidewall protection film 311 may be formed of an oxide film to repair damage to the sidewalls of the first and second trenches and to protect the sidewalls of the first and second trenches.

The second sidewall protection film 312 may be formed, for example, by performing annealing for more than 20 minutes in the environment of a gaseous mixture containing NO and $N_2$ at a temperature of 850° C. or more after forming the first sidewall protection film 311. For example, the second sidewall protection film 312 may be formed of a nitride film. The second sidewall protection film 312 may serve as a pad for buffering stress when forming the seventh and eighth element isolation film patterns 470 and 480.

The seventh element isolation film pattern 470 is formed in the first region to define a first active region. The seventh element isolation film pattern 470 may be formed by filling a second material in the first trench formed in the first region.

The eighth element isolation film pattern 480 is formed in the second region to define a second active region. The eighth element isolation film pattern 480 may be formed by filling a first material in the second trench formed in the second region.

The first and second materials may be different. For example, the first material may be formed of an oxide such as silicon oxide, and the second material may be formed of a nitride such as silicon nitride. In one embodiment, the first material may be formed of high temperature oxide (HTO), medium temperature oxide (MTO), plasma enhanced tetraethyl orthosilicate (PE-TEOS), spin on glass (SOG), undoped silicate glass (USG), high density plasma (HDP), CVD oxide, tonen silazene (TOSZ), or a combination thereof.

Figure 7:
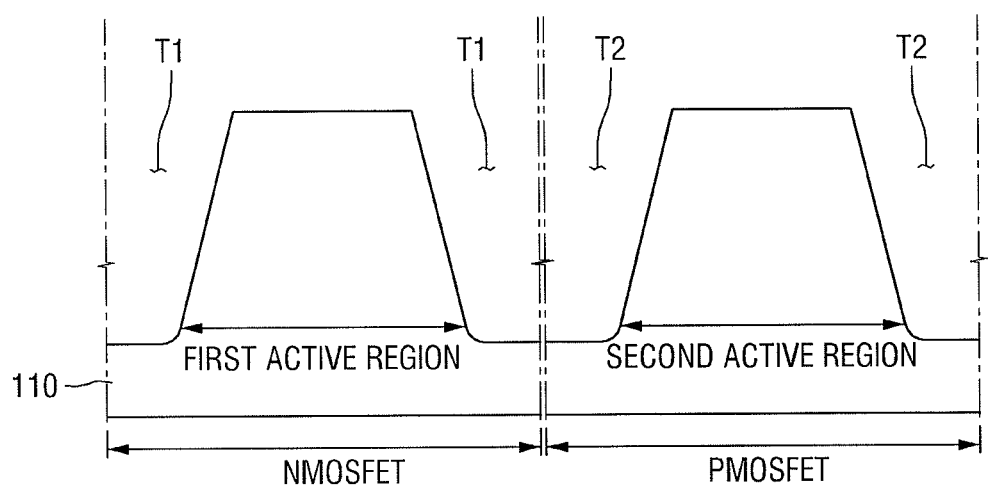
FIGS. 7 to 11 illustrate operations included in an embodiment of a method for fabricating a semiconductor memory device.

FIGS. 7 to 11 illustrate operations included in an embodiment of a method for fabricating a semiconductor memory device. Referring to FIG. 7, an initial operation includes preparing a substrate 110 including a first region and a second region. For example, the first region may be the NMOSFET region and the second region may be the PMOSFET region. The substrate 110 may be formed, for example, of at least one semiconductor material selected from the group consisting of Si, Ge, SiGe, GaP, GaAs, SiC, SiGeC, InAs and InP. In one embodiment, the substrate 110 may be formed of a silicon on insulator (SOI). Then, a first trench T1 and a second trench T2 may be formed in the first region and the second region, respectively.

Figure 8:
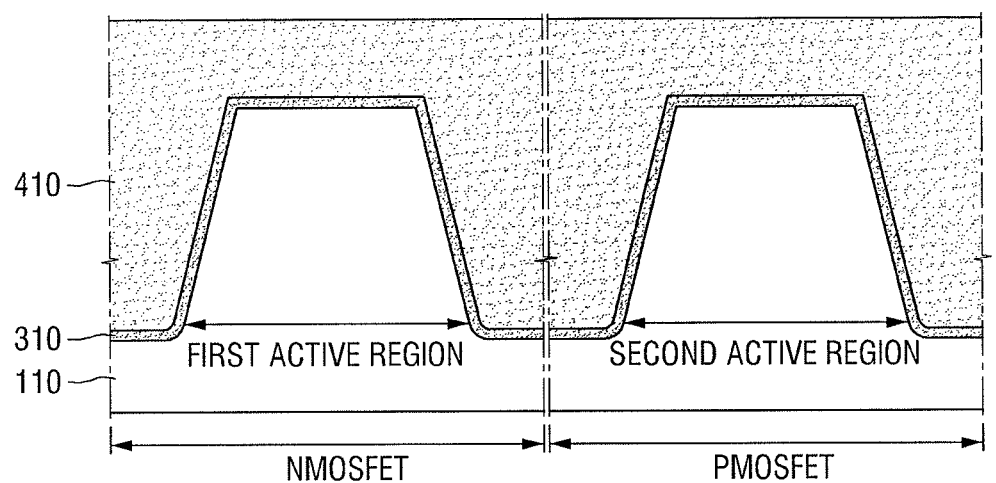

Subsequently, referring to FIG. 8, the sidewall protection film 310 is formed in the first trench T1 and the second trench T2. A first material 410 is filled in the first trench T1 and the second trench T2. When filling the first material 410, the first material 410 may be deposited on the sidewall protection film 310 to cover the entire surface of the substrate 110.

Figure 9:
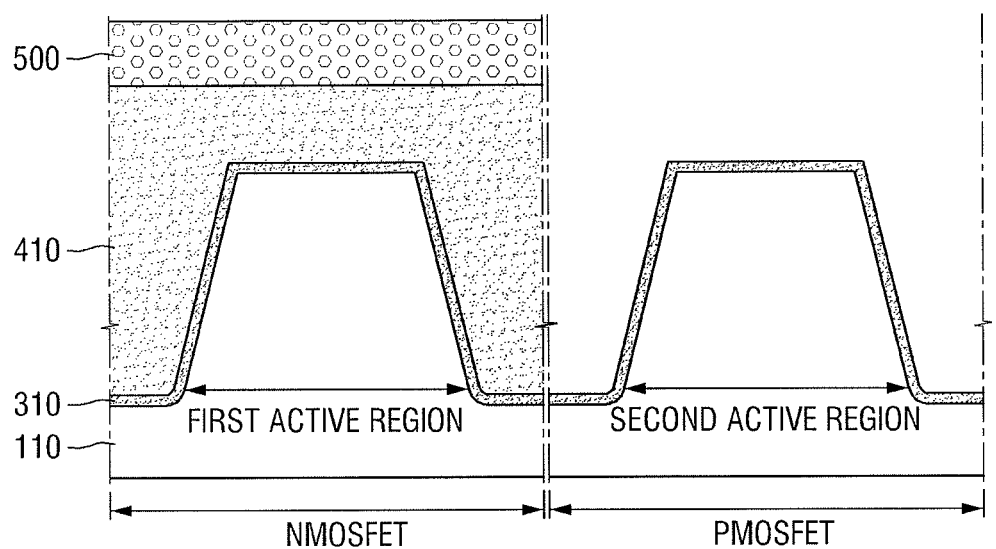

Referring to FIG. 9, the first material 410 filled in the second trench T2 in the second region is then removed using a mask 500 covering the first region. For example, the first material 410 deposited in the second region of the substrate 110 is removed. In this case, the first material 410 in the second region may be removed using an etching process. For example, after hydrogen fluoride (HF) is mixed with a phosphoric acid ($H_3PO_4$) solution, the first material 410 deposited in the second region may be removed by a wet etching process using the mixture of HF and $H_3PO_4$.

Figure 10:
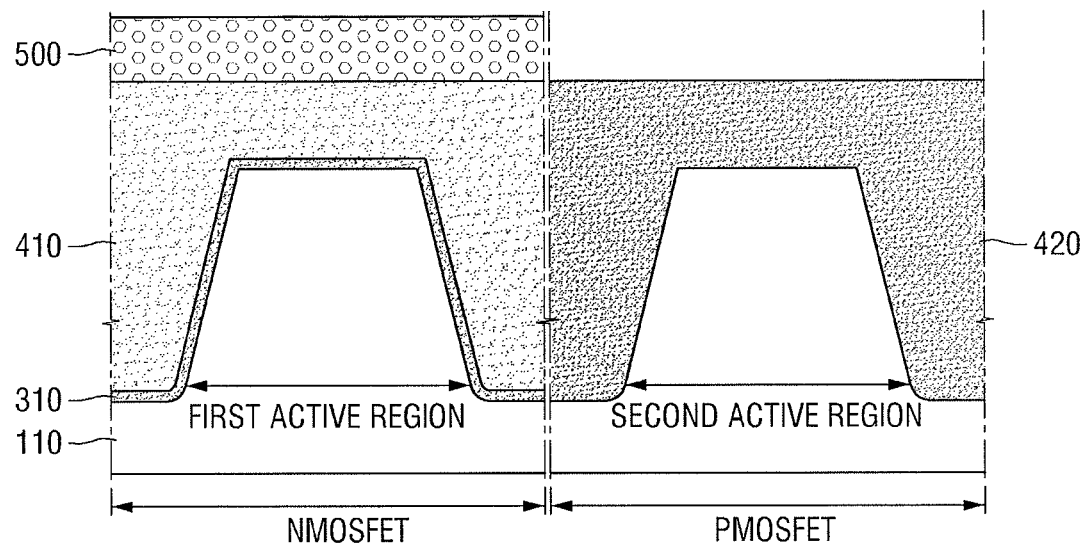

Referring to FIG. 10, the second material 420 is then filled in the second trench T2 in the second region. The first material 410 and the second material 420 may be different. In one embodiment, the second material 420 may be the same material included in the sidewall protection film 310.

For example, the dielectric constant of the first material 410 may be lower than the dielectric constant of the second material 420. In one embodiment, the first material 410 may be formed of an oxide such as silicon oxide, and the second material 420 may be formed of a nitride such as silicon nitride. For example, the first material may be formed of high temperature oxide (HTO), medium temperature oxide (MTO), plasma enhanced tetraethyl orthosilicate (PE-TEOS), spin on glass (SOG), undoped silicate glass (USG), high density plasma (HDP), CVD oxide, tonen silazene (TOSZ), or a combination thereof.

Figure 11:
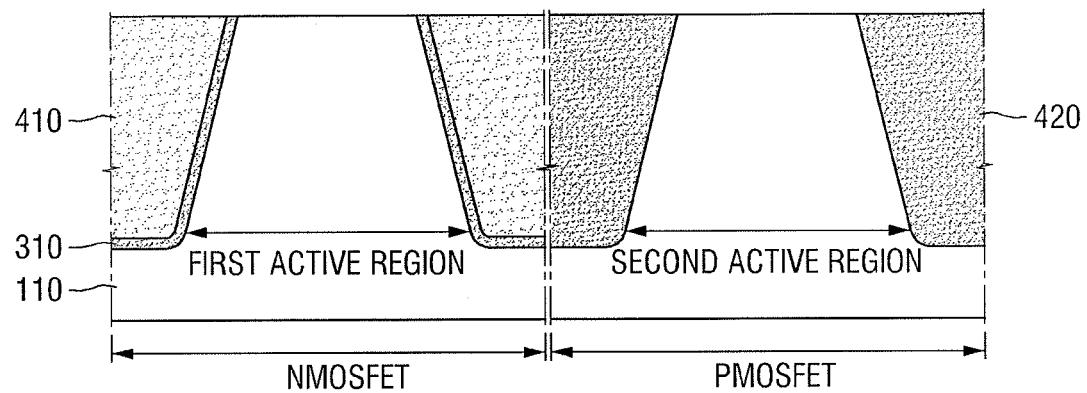

Referring to FIG. 11, the first and second materials 410 and 420 on the first and second active regions are then removed to expose upper surfaces of the first and second active regions. By this process, the element isolation film patterns are formed to define the first and second active regions. In a subsequent process, first and second gate patterns may be further formed in the first and second active regions, respectively (see, e.g., FIG. 4).

Figure 12:
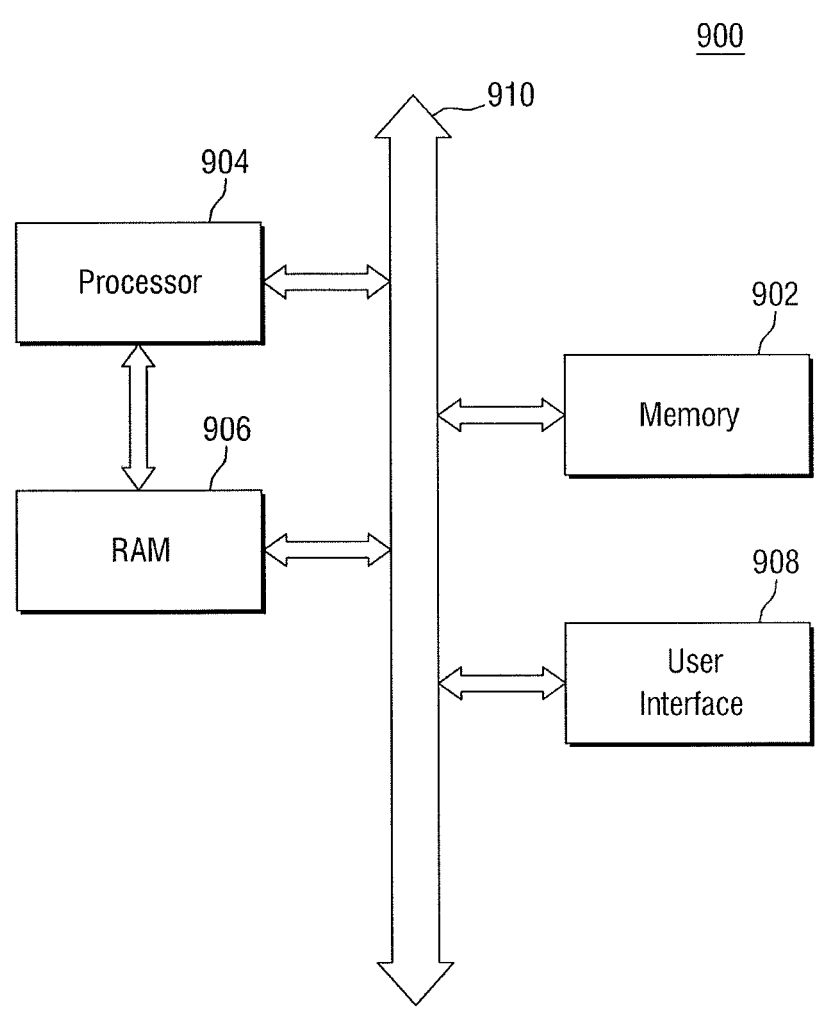
FIG. 12 illustrates an embodiment of an electronic system.

FIG. 12 illustrates an embodiment of an electronic system 900 including a semiconductor memory according to one or more of the aforementioned embodiments. Referring to FIG. 12, an electronic system 900 includes a memory system 902, a processor 904, a random access memory (RAM) 906, and a user interface 908. The memory system 902, the processor 904, the RAM 906, and the user interface 908 may perform data communication with each other via a bus 910.

The processor 904 may execute a program and control predetermined operations of the electronic system 900. The processor 904 may include at least one of a micro-processor, a digital signal processor, a micro-controller, and/or other logic devices for performing predetermined functions.

The RAM 906 may be used as an operating memory of the processor 904. The RAM 906 may be, for example, a dynamic random access memory (DRAM). In this case, the above-described semiconductor memory devices may be employed in the RAM 906. The processor 904 and the RAM 906 may be implemented to be packaged into a semiconductor device or semiconductor package.

The user interface 908 may be used to input/output data to/from the electronic system 900. The user interface 908 may include, for example, a keypad, a keyboard, an image sensor, and/or a display device.

The memory system 902 may store code for operation of the processor 904, data processed by the processor 904, or externally input data. The memory system 902 may include a separate controller for driving and may be configured to additionally include an error correction block. The error correction block may be configured to detect and correct errors of data stored in the memory system 902 using error correction codes (ECC).

In an information processing system such as a mobile device and a desktop computer, the memory system 902 may include a flash memory. The flash memory may be a semiconductor disk device (e.g., solid state drive (SSD)). In this case, the electronic system 900 may reliably store a large amount of data in the flash memory.

The memory system 902 may be integrated into one semiconductor memory device. For example, the memory system 902 may be integrated into one semiconductor memory device to constitute a memory card. In one implementation, the memory system 902 may be integrated into one semiconductor memory device to constitute a memory card such as a PC card (e.g., personal computer memory card international association (PCMCIA)), a compact flash card (CF), a smart media card (SM, SMC), a memory stick, a multimedia card (MMC, RS-MMC, MMCmicro), a SD card (SD, miniSD, microSD, SDHC), or a universal flash storage device (UFS).

Figure 13:
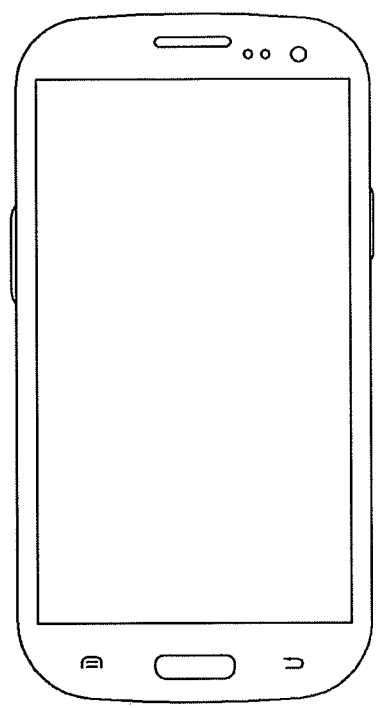
FIG. 13 illustrates an application for the electronic system of FIG. 12.

The electronic system 900 shown in FIG. 12 may be applied to an electronic controller of various electronic apparatuses. FIG. 13 illustrates an example in which the electronic system 900 of FIG. 12 is applied to a smart phone 1000. In this case, the electronic system 900 may be employed as a component of an application processor (AP).

Figure 14:
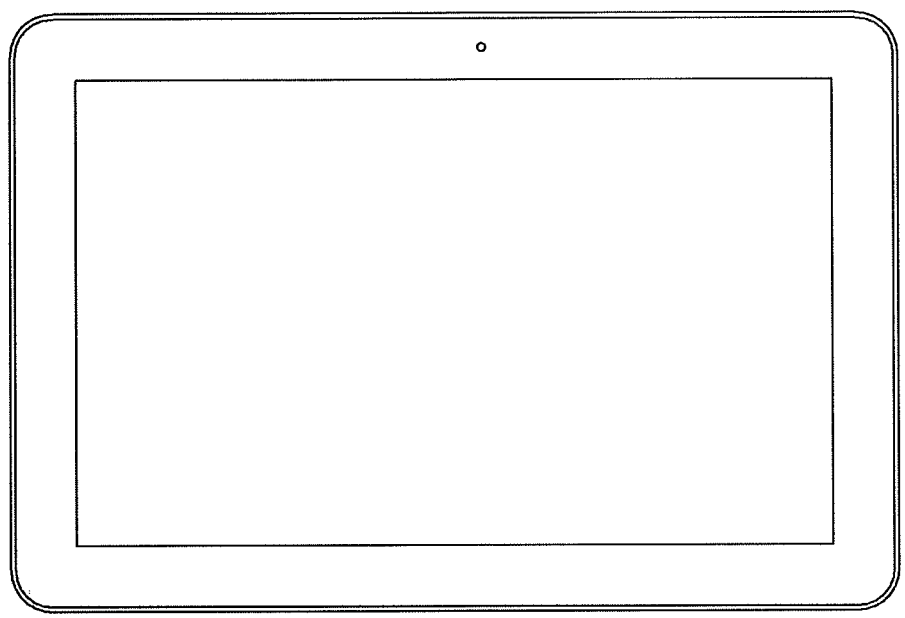
FIG. 14 illustrates another application for the electronic system of FIG. 12.
Figure 15:
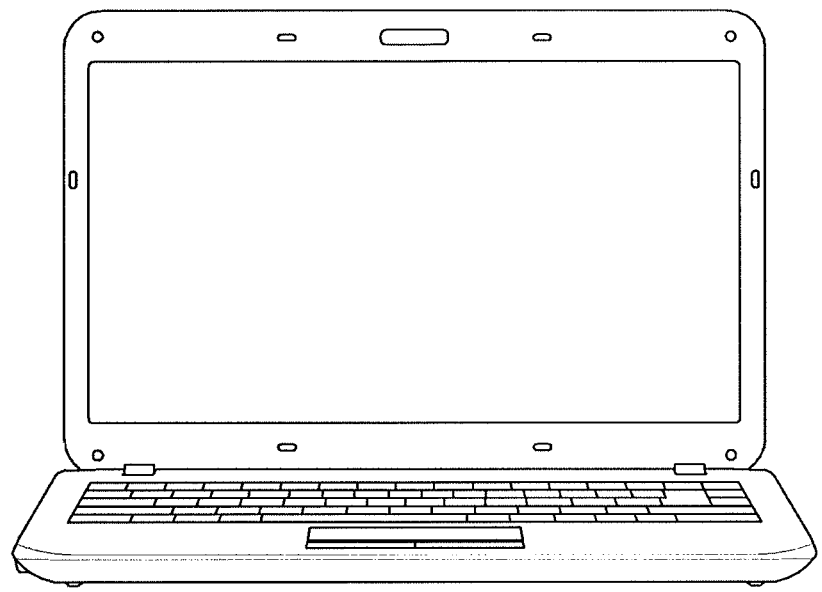
FIG. 15 illustrates another application for the electronic system of FIG. 12.

The electronic system 900 of FIG. 12 may be employed in other electronic apparatuses. FIG. 14 illustrates an example in which the electronic system 900 is applied to a tablet PC 1100. FIG. 15 illustrates an example in which the electronic system 900 is applied to a laptop 1200.

Additionally, or alternatively, the electronic system 900 may be provided as one of various components of an electronic apparatus such as a personal computer, ultra mobile PC (UMPC), workstation, net-book, personal digital assistants (PDA), portable computer, web tablet, wireless phone, mobile phone, smart phone, e-book, portable multimedia player (PMP), portable game console, navigation device, black box, digital camera, 3-dimensional television, digital audio recorder, digital audio player, digital picture recorder, digital picture player, digital video recorder, digital video player, apparatus capable of transmitting and receiving information in wireless environment, one of various electronic apparatuses constituting the home network, one of various electronic apparatuses constituting the computer network, one of various electronic apparatuses constituting the telematics network, RFID device, or one of various components forming the computing system.

When the electronic system 900 is equipment capable of performing wireless communications, the electronic system 900 may be used in communication systems such as code division multiple access (CDMA), global system for mobile communication (GSM), North American digital cellular (NADC), enhanced-time division multiple access (E-TDMA), wideband code division multiple access (WCDAM), or CDMA2000, to name a few.

In accordance with one or more of the aforementioned embodiments, a semiconductor memory device is provided with improved transistor characteristics achieved using different dielectric materials as shallow trench isolation (STI) gap-fill materials for NMOSFET and a PMOSFET regions. Also, a method for fabricating such a semiconductor memory device also provided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A semiconductor memory device, comprising:
a substrate including a first region and a second region;
a first element isolation film pattern in the first region to define a first active region, the first element isolation film pattern being in a first trench;
a second element isolation film pattern in the second region to define a second active region, the second element isolation film pattern being in a second trench;
a first sidewall protection film on sidewalls of the first and second trenches; and
a second sidewall protection film on the first sidewall protection film, wherein the first element isolation film pattern includes a first material and the second element isolation film pattern includes a second material different from the first material, and the first sidewall protection film and the second sidewall protection film include different materials from each other, and wherein the first material is an oxide and the second material is a nitride or the first material is a nitride and the second material is an oxide.

2. The device as claimed in claim 1, wherein the sidewall protection film includes an oxide.

3. A semiconductor memory device, comprising:
a substrate including a first region and a second region;
a first element isolation film pattern in the first region to define a first active region, the first element isolation film pattern being in a first trench;
a second element isolation film pattern in the second region to define a second active region, the second element isolation film pattern being in a second trench;
a sidewall protection film on a sidewall of the first trench, the sidewall protection film not being on sidewall of the second trench;
a first gate pattern in the first active region; and
a second gate pattern in the second active region, wherein the first element isolation film pattern includes a first material and the second element isolation film pattern includes a second material different from the first material, and wherein the first material is an oxide and the second material is a nitride or the first material is a nitride and the second material is an oxide.

4. The device as claimed in claim 3, wherein at least one of the first or second gate patterns corresponds to a recess channel transistor.

5. The device as claimed in claim 3, wherein the sidewall protection film includes an oxide.

6. A semiconductor device, comprising:
a first insulation material;
a first transistor including a first gate adjacent the first insulation material;
a second insulation material; and
a second transistor including a second gate adjacent the second insulation material, wherein the first transistor is adjacent to the second transistor and has a conductivity type different from the second transistor, wherein an upper surface of the first gate is lower than an upper surface of the first insulation material and an upper surface of the second gate is lower than an upper surface of the second insulation material, and wherein the first insulation material is different from the second insulation material.

7. The device as claimed in claim 6, wherein the first insulation material has a dielectric constant lower than the second insulation material.

8. The device as claimed in claim 6, wherein:
the first insulation material includes an oxide material, and
the second insulation material includes a nitride material.

9. The device as claimed in claim 6, wherein at least one of the first or second insulation material includes a material of a sidewall protection film.

* * * * *